US008188481B2

(12) United States Patent
Yanagisawa

(10) Patent No.: US 8,188,481 B2
(45) Date of Patent: May 29, 2012

(54) DISPLAY PANEL

(75) Inventor: Syou Yanagisawa, Mobara (JP)

(73) Assignees: Hitachi Displays, Ltd., Chiba (JP); Panasonic Liquid Crystal Display Co., Ltd., Hyogen-ken (JP)

( * ) Notice: Subject to any disclaimer, the term of this patent is extended or adjusted under 35 U.S.C. 154(b) by 60 days.

(21) Appl. No.: 12/896,940

(22) Filed: Oct. 4, 2010

(65) Prior Publication Data
US 2011/0079789 A1 Apr. 7, 2011

(30) Foreign Application Priority Data
Oct. 5, 2009 (JP) .................................. 2009-231968

(51) Int. Cl.
H01L 27/14 (2006.01)

(52) U.S. Cl. ........... 257/72; 257/E33.053; 257/E51.005; 349/42; 349/43; 349/149

(58) Field of Classification Search .................... 257/72, 257/E33.053, E51.005; 349/42, 43, 149, 349/152
See application file for complete search history.

(56) References Cited

U.S. PATENT DOCUMENTS

| 6,750,926 B2 | 6/2004 | Ohgiichi et al. | |
| 6,882,397 B2 | 4/2005 | Hayata et al. | |
| 7,002,658 B2* | 2/2006 | Komeno et al. | 349/149 |
| 2004/0046920 A1* | 3/2004 | Hayata et al. | 349/149 |
| 2004/0207772 A1* | 10/2004 | Tomita | 349/42 |
| 2006/0244741 A1* | 11/2006 | Kimura et al. | 345/204 |

FOREIGN PATENT DOCUMENTS

| JP | 2001-324721 | 11/2001 |
| JP | 2004-101863 | 4/2004 |

* cited by examiner

Primary Examiner — Khiem D Nguyen
(74) Attorney, Agent, or Firm — Antonelli, Terry, Stout & Kraus, LLP.

(57) ABSTRACT

A display panel includes a plurality of pads, a plurality of first contacts connected to the pads, a plurality of second contacts provided so as to be opposed to the plurality of first contacts, a polysilicon layer configured to form a plurality of polysilicon films to connect the plurality of first contacts and second contacts, and a gate metal layer. The gate metal layer forms at least one gate metal. The gate metal layer traverses the plurality of polysilicon films so as to form a plurality of transistors. The plurality of transistors are arranged in a zigzag pattern for each transistor set. A width of a portion of each of the polysilicon films, the portion forming a corresponding one of the transistors, is larger than a width of another portion of the polysilicon films. The other portion is connected to a corresponding one of the first contacts and second contacts.

12 Claims, 9 Drawing Sheets

DISPLAY PANEL

CROSS-REFERENCE TO RELATED APPLICATION

The present application claims priority from Japanese application JP 2009-231968 filed on Oct. 5, 2009, the content of which is hereby incorporated by reference into this application.

BACKGROUND OF THE INVENTION

1. Field of the Invention

The present invention relates to a display panel, in particular, a display panel including an inspection circuit for detecting defects.

2. Description of the Related Art

A liquid crystal display panel using thin-film transistors is known as a display panel and is widely used for a television set, a personal-computer display, a cellular phone, and the like.

The liquid crystal display panel generally includes: a display region in which a plurality of pixels are formed; and a peripheral region surrounding the display region. In recent years, with an increase in area of the display region, the peripheral region is reduced. Accordingly, it becomes difficult to ensure a space for providing inspection terminals in the peripheral region. The inspection terminals are provided to turn the liquid crystal display panel ON for inspection of the liquid crystal display panel. Therefore, as a method for detecting a defect of the liquid crystal display panel, a pseudo dynamic lighting inspection (hereinafter, referred to as "QD lighting inspection") is used (see JP 2004-101863 A and JP 2001-324721 A). According to the QD lighting inspection, the number of inspection terminals can be reduced by providing an inspection circuit to the liquid crystal display panel.

FIG. 9 is a schematic diagram of a display panel in the related art. A driver for driving liquid crystal (hereinafter, referred to simply as "driver") provided to the display panel does not have an RGB switching function. A part of a circuit other than drain lines is omitted in FIG. 9.

As illustrated in FIG. 9, a display panel 900 includes a pixel region section 903 and a driver region section 980. In the pixel region section 903, a pixel region 901 and inspection transistors 902 are provided. In the driver region section 980, a driver installation region 904 in which a driver is provided, an R drain-line inspection terminal 905, a G drain-line inspection terminal 906, and a B drain-line inspection terminal 907 are provided.

The inspection transistors 902 are provided in an area of the pixel area section 903, which is situated on the opposite side to the driver installation region 904 as viewed from the pixel region 901. The inspection transistors 902 are respectively provided so as to correspond to R-pixels, G-pixels, and B-pixels provided in the pixel region 901. Drains of the inspection transistors 902 are connected to an R inspection wiring 908, a G inspection wiring 909, and a B inspection wiring 910 according to RGB of the pixels in the pixel region 901. Further, the R inspection wiring 908, the G inspection wiring 909, and the B inspection wiring 910 are respectively connected to the R drain-line inspection terminal 905, the G drain-line inspection terminal 906, and the B drain-line inspection terminal 907 provided in the driver region section 980. A gate of each of the inspection transistors 902 is connected to a gate line terminal 912 provided in the driver region section 980 through an intermediation of a gate wiring 911. A wiring from a source of each of the inspection transistors 902 passes through the pixel region 901 to be provided in the driver installation region 904.

In this case, there is a problem that breaking or short-circuiting cannot be detected for the wirings provided in an area from the driver installation region 904 to the pixel region 901.

Therefore, in the case where the driver has the RGB switching function, a configuration in which an inspection circuit is provided in the driver installation region is known as illustrated in FIG. 10. In FIG. 10, a part of the circuit other than the drain lines is omitted.

As illustrated in FIG. 10, a display panel 960 includes RGB switches 920 provided in an area of the pixel region section 903, which is situated between the driver installation region 904 in which the driver is provided and the pixel region 901. RGB-switch terminals 921, 922, and 923 are provided in the driver region section 980.

A source of each of the RGB switches 920 is connected to one of the R-, G-, and B-pixels provided in the pixel region 901. Gates of the RGB switches 920 are connected to the RGB-switch terminals 921, 922, and 923 through an intermediation of RGB-switch gate wirings 971, 972, and 973, for a corresponding one of the R-, G-, and B-pixels provided in the pixel region 901. After the RGB switches 920, each including three transistors, are connected in parallel to each other, a drain of the RGB switches 920 is connected to a source of each of the inspection transistors 930 by a wiring. Further, a drain-line inspection terminal 941 is connected to a drain of each of the inspection transistors 930 through an intermediation of a drain-line inspection wiring 940, whereas a gate line terminal 951 is connected to a gate of each of the inspection transistors 930 through an intermediation of a gate wiring 950.

In comparison with the case illustrated in FIG. 9, switching can be performed by the RGB switches 920 to conduct the QD lighting inspection in this case. Therefore, the number of the inspection transistors 930 can be reduced to one-third, which allows a large area to be ensured for the inspection circuit including the inspection transistors 930. As a result, even if output terminals of the driver become extremely fine, a desired width of each of the inspection transistors can be ensured. Moreover, the breaking or the short-circuiting of the wiring from each of the output terminals of the driver to the pixel region can be detected.

SUMMARY OF THE INVENTION

In the case where a driver without the RGB switching function is used for an LTPS-TFT panel, however, a sufficiently large width cannot be ensured for each of the inspection transistors when the QD lighting inspection circuit is provided in the driver installation region in a simple manner. Therefore, there is a problem that the QD lighting inspection cannot be appropriately conducted. This problem is described below referring to FIG. 11. FIG. 11 is a schematic diagram of an inspection circuit formed by simply arranging the inspection transistors in one row.

As illustrated in FIG. 11, pads 140 for the driver, to which the output terminals of the driver are connected, are connected by metal wirings 151 to pad connection contacts 150 which are, for example, arranged in a row. Moreover, at the positions opposed to the pad connection contacts 150, inspection wiring connection contacts 160 are provided. Each of the pad connection contacts 150 and a corresponding one of the inspection wiring connection contacts 160 are connected to each other by a polysilicon film 120. By providing a single gate metal 130 across the polysilicon films 120, inspection transistors 110 arranged in a row are formed.

The polysilicon films 120 are formed in a polysilicon layer, whereas the gate metal 130 is formed in a gate metal layer which is different from the polysilicon layer. Moreover, each of an R inspection wiring 181, a G inspection wiring 182, and a B inspection wiring 183 is connected to a corresponding one of the inspection wiring connection contacts 160 by using a metal wiring 184, a gate wiring 185 in the same layer as that of the gate metal 130, a contact 186, and the like.

In the configuration illustrated in FIG. 11, each of the inspection transistors 110 is formed by providing the gate metal 130 across each of the polysilicon films 120. The details of the formation of the transistors and each of the layers are the same as those described below in an embodiment of the present invention, and therefore are herein omitted.

In this case, the width of each of the pad connection contacts 150 is limited by a distance between the pads 140 to which the output terminals of the driver are connected, while a width of each of the inspection transistors 110 is limited by a width of each of the pad connection contacts 150. Specifically, the width of each of the inspection transistors 110 is limited by the distance between the output terminals of the driver.

Therefore, there is a problem that a sufficient width cannot be ensured for each of the inspection transistors 110 when a highly sophisticated driver with an extremely small distance between the output terminals is used. More specifically, for example, in the case where the configuration illustrated in FIG. 11 is used, a width of only 10 μm is ensured as the width of each of the inspection transistors for the aforementioned reason, characteristics of polysilicon, and reasons in terms of a method of fabricating the polysilicon layer, when the output terminals of the driver are provided at intervals of 15 μm. For the QD lightning inspection by appropriately lighting the display panel, the width of the inspection transistor is required to be 13 μm or larger. Therefore, the aforementioned width is insufficient for the QD lighting inspection.

In view of the problem described above, the present invention has an object to provide a display panel including an inspection circuit in which a desired width of an inspection transistor is ensured even if a distance between output terminals of a driver is extremely small in the case where a driver used for the display panel is a highly sophisticated one without an RGB switching function.

(1) A display panel according to the present invention includes: a plurality of pads configured to provide a driver thereon; a plurality of first contacts respectively connected to the plurality of pads; a plurality of second contacts respectively provided so as to be opposed to the plurality of first contacts; a polysilicon layer configured to form a plurality of polysilicon films to connect the plurality of first contacts and the plurality of second contacts to each other; and a gate metal layer different from the polysilicon layer. The gate metal layer forms at least one gate metal. The gate metal layer traverses the plurality of polysilicon films so as to form a plurality of transistors. The plurality of transistors are arranged in a zigzag pattern for each transistor set including at least one adjacent transistor. A width of a portion of each of the plurality of polysilicon films, the portion forming a corresponding one of the plurality of transistors, is larger than a width of another portion of the each of the plurality of polysilicon films, the another portion being connected to a corresponding one of the plurality of first contacts and the plurality of second contacts.

(2) In the display panel according to the item (1), the plurality of transistors include a plurality of transistor rows, each including at least two adjacent transistors, and the plurality of transistor rows are arranged in the zigzag pattern.

(3) In the display panel according to the item (2), a number of the transistors included in each of the plurality of transistor rows is four or less.

(4) In the display panel according to the item (2), the plurality of transistor rows have an overlapping portion when the plurality of second contacts are viewed from the plurality of first contacts.

(5) In the display panel according to the item (2), a width of a portion of the each of the plurality of polysilicon films located between the plurality of transistor rows is smaller than the width of the portion of the each of the plurality of polysilicon films, the portion forming the corresponding one of the plurality of transistors.

(6) In the display panel according to the item (1), the gate metal layer includes two gate metals, and the plurality of transistors are arranged in the zigzag pattern for each one of the plurality of transistors.

(7) In the display panel according to the item (6), the plurality of first contacts and the plurality of second contacts are respectively arranged in the zigzag patterns in a direction in which the plurality of pads are arranged.

(8) In the display panel according to the item (7), the plurality of first contacts and the plurality of second contacts form one contact row between the two gate metals.

(9) In the display panel according to the item (7), the display panel further includes a plurality of metal wirings in a metal wiring layer. The metal wiring layer is formed as a layer different from the polysilicon layer and the gate metal layer. Each of the plurality of metal wirings is connected to a corresponding one of the plurality of first contacts and a corresponding one of the plurality of second contacts. A width of the each of the plurality of metal wirings is smaller than widths of each of the plurality of first contacts and each of the plurality of second contacts.

(10) In the display panel according to the item (8), the two gate metals traverse the plurality of metal wirings connected to the plurality of first contacts and the plurality of second contacts forming the one contact row.

(11) In the display panel according to the item (1), the width of the portion of the each of the plurality of polysilicon films, the portion forming the corresponding one of the plurality of transistors, is larger than widths of each of the plurality of first contacts and each of the plurality of second contacts.

(12) In the display panel according to the item (1), the display panel further includes an insulating layer between the polysilicon layer and the gate metal layer.

The display panel, on which the highly sophisticated driver having an extremely small distance between the output terminals without the RGB switching function is to be mounted, can include the inspection circuit in which the desired width of each of the inspection transistors is ensured.

DETAILED DESCRIPTION OF THE INVENTION

A display panel according to an embodiment of the present invention is obtained by providing an inspection circuit in a driver installation region of, for example, an LTPS-TFT liquid crystal display panel. The driver to be provided does not have an RGB switching function.

Figure 1:
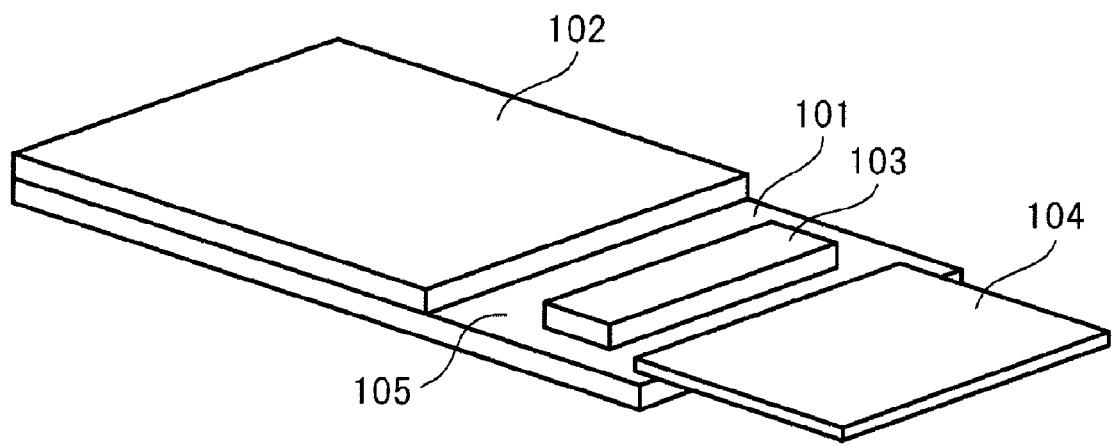
FIG. 1 is a schematic diagram illustrating a liquid crystal display device according to an embodiment of the present invention.

FIG. 1 is a block diagram illustrating a schematic configuration of a liquid crystal display device according to the embodiment of the present invention. As illustrated in FIG. 1, the liquid crystal display device according to this embodiment includes a TFT substrate 101 and a counter substrate 102. Pixel electrodes, thin-film transistors (hereinafter, abbreviated as TFTs), and the like are provided on the TFT substrate 101, whereas a color filter and the like are formed on the counter substrate 102. The TFT substrate 101 and the counter substrate 102 are bonded to each other by a sealing material provided in a frame-like pattern on the respective frame regions of the TFT substrate 101 and the counter substrate 102. Then, liquid crystal is injected and sealed inside the sealing material between the substrates 101 and 102 through a liquid-crystal injection port provided to a part of the sealing material. Then, polarizing plates are bonded on the respective outer surfaces of the substrates 101 and 102 to constitute the liquid crystal display device. Specifically, the liquid crystal is sandwiched between the pair of substrates.

The TFT substrate 101 has a larger area than that of the counter substrate 102. In a region 105 of the TFT substrate 101, which does not overlap the counter substrate 102, a driver 103 for driving the TFTs is mounted. In an area of the region 105 on the side of the driver 103, which is opposite to the counter substrate 102, a flexible wiring board 104 is provided.

Although the example where the liquid crystal display device is driven by the driver 103 is described in this embodiment, a driver circuit may alternatively be formed on the TFT substrate 101 by using the TFTs or the like. In addition, the color filter may be provided on the TFT substrate 101 instead of being provided on the counter substrate 102. Further, when the liquid crystal display device uses a field sequential method, the color filter is not required. Instead, three-color light sources, that is, RGB light sources are used. Moreover, counter electrodes are provided on the counter substrate 102 in the case where a TN or VA method is used for the liquid crystal display device, whereas the counter electrodes are provided on the TFT substrate 101 in the case where an in-plane switching (IPS) method is used for the liquid crystal display device.

Figure 2:
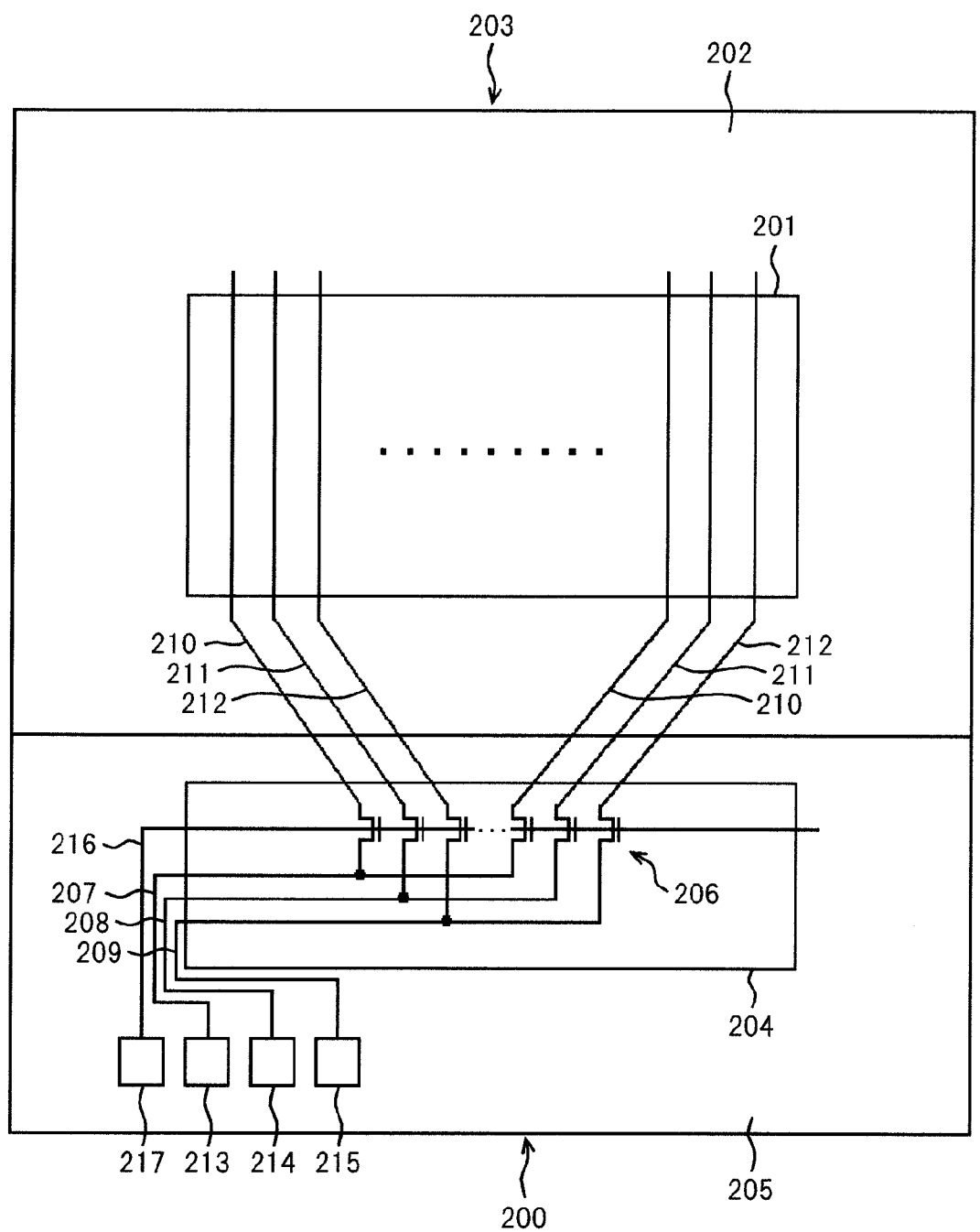
FIG. 2 is a schematic diagram illustrating a liquid crystal display panel according to the embodiment of the present invention.

FIG. 2 is a schematic diagram of a display panel including inspection transistors provided in a driver installation region in the case where the driver does not have an RGB switching function. FIG. 2 illustrates a state before the driver is provided on the TFT substrate 101 illustrated in FIG. 1. As illustrated in FIG. 2, a display panel 200 includes a pixel region section 203 and a driver region section 205. The pixel region section 203 includes a pixel region 201 and a peripheral region 202 corresponding to a peripheral area surrounding the pixel region 201, whereas the driver region section 205 includes a driver installation region 204 where the driver is provided and the like. In this case, the driver installation region 204 is a region where the driver is provided after the QD lighting inspection is conducted.

In the driver installation region 204, a plurality of inspection transistors 206 are sequentially arranged so as to respectively correspond to R-, G-, and B-pixels provided in the pixel region 201. Sources of the inspection transistors 206 are respectively connected to the R-, G-, B-pixels provided in the pixel region 201 by source wirings 210, 211, and 212. Drains of the inspection transistors 206 are respectively connected to an R drain-line inspection terminal 213, a G drain-line inspection terminal 214, and a B drain-line inspection terminal 215 through an R inspection wiring 207, a G inspection wiring 208, and a B inspection wiring 209, respectively. Gates of the inspection transistors 206 are connected to a gate terminal 217 through a gate wiring 216.

Although the R inspection wiring 207, the G inspection wiring 208, and the B inspection wiring 209 are arranged in this order from the side closer to the inspection transistors 206 in FIG. 2, the R inspection wiring 207, the G inspection wiring 208, and the B inspection wiring 209 may be arranged in a different order. Moreover, the arrangement of the inspection transistors 206 illustrated in FIG. 2 is schematically illustrated and therefore is not limited thereto. The details of the arrangement of the inspection transistors 206 are described below.

The display panel 200 having the configuration as described above is inspected in the following manner, for example. A predetermined voltage is applied in a predetermined form to each of the R drain-line inspection terminal 213, the G drain-line inspection terminal 214, the B drain-line inspection terminal 215, and the gate terminal 217 to observe a display state of the display panel 200. In this manner, breaking of each color video line or short-circuiting between the adjacent video lines can be inspected.

Figure 3:
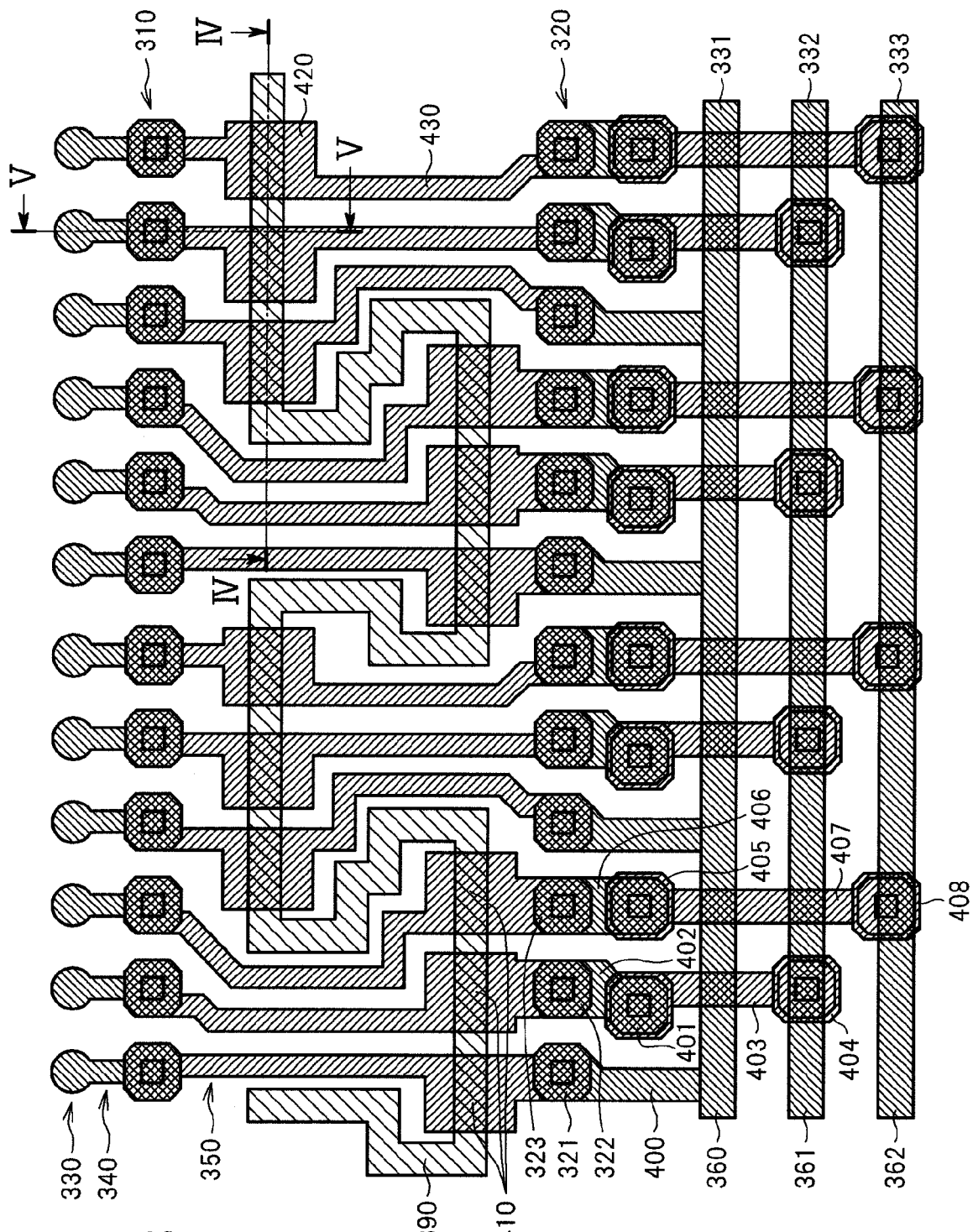
FIG. 3 is a schematic diagram illustrating a QD lighting inspection circuit for the liquid crystal display panel according to the embodiment of the present invention.
Figure 4:
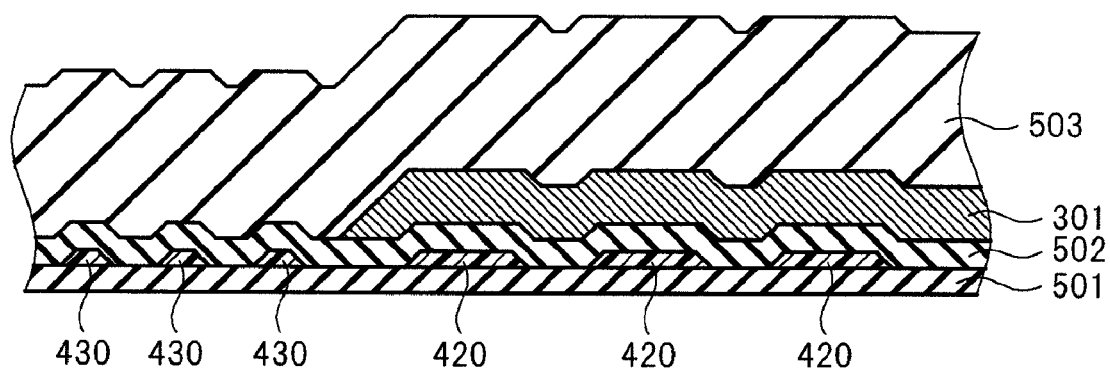
FIG. 4 is an enlarged sectional view of the QD lighting inspection circuit, taken along the line IV-IV of FIG. 3.
Figure 5:
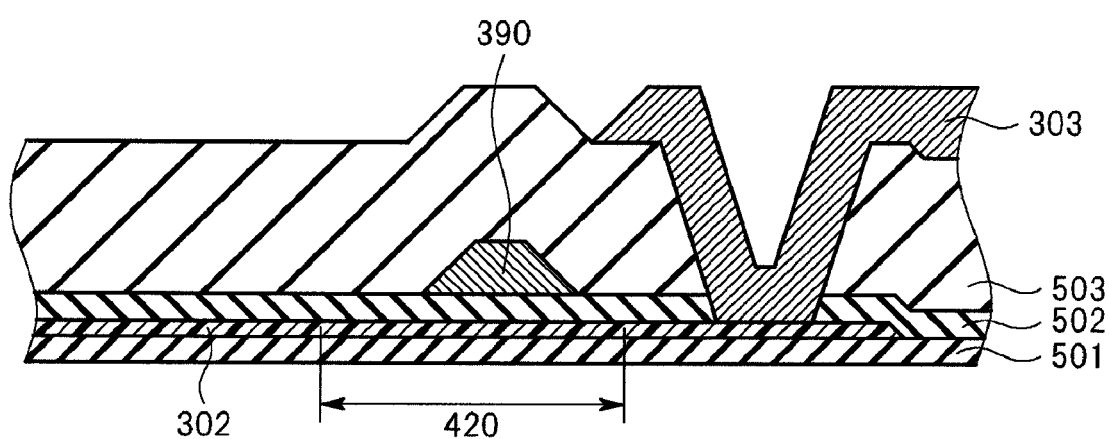
FIG. 5 is an enlarged sectional view of the QD lighting inspection circuit, taken along the line V-V of FIG. 3.

FIG. 3 is a schematic diagram of an inspection circuit in which transistor groups, each including three adjacent transistors, are arranged in a zigzag pattern, and illustrates the periphery of the inspection transistors 206 illustrated in FIG. 2 in an enlarged manner. FIG. 4 is an enlarged sectional view taken along the line IV-IV of FIG. 3, and FIG. 5 is an enlarged sectional view taken along the line V-V of FIG. 3. As illustrated in FIGS. 3 to 5, the inspection circuit including the inspection transistors or the like includes a gate metal layer 301, a polysilicon layer 302, an SD metal layer 303, and insulating layers 501, 502, and 503. Polysilicon films 350 described below are formed in the polysilicon layer 302, whereas a gate metal 390 is formed in the gate metal layer 301. Pad connection contacts 310, inspection wiring connection contacts 320, contacts 401 and 404, an R inspection wiring 360, a G inspection wiring 361, a B inspection wiring 362, and metal wirings 340, 400, 402, and 406 for connection to the pad connection contacts 310 and the like are formed in the SD metal layer 303.

As illustrated in FIG. 3, pads 330 for receiving output terminals of the driver 103 are formed in the driver installation region 204 of the display panel 200. The pads 330 are connected to the pad connection contacts 310 through metal wirings 340, respectively. At the positions opposed to the pad connection contacts 310, the inspection wiring connection contacts 320 are formed. Further, the inspection wiring connection contacts 320 are connected to the R inspection wiring 360, the G inspection wiring 361, and the B inspection wiring 362 in this order from the left of FIG. 3.

The R inspection wiring 360, the G inspection wiring 361, and the B inspection wiring 362 are arranged in this order from the side closer to the inspection wiring connection contacts 320 so as to be in parallel to the inspection wiring connection contacts 320. An inspection wiring connection contact 321 corresponding to the first inspection wiring connection contact 320 from the left of FIG. 3 is connected to the R inspection wiring 360 through an intermediation of the metal wiring 400.

An inspection wiring connection contact 322 corresponding to the second inspection wiring connection contact 320 from the left is first connected to the contact 401 adjacent thereto through an intermediation of the metal wiring 402 and is then connected to the G inspection wiring 361 through an intermediation of a wiring traversing line 403 and the contact 404. The wiring traversing line 403 is formed in the gate metal layer and intersections the R inspection wiring 360 in an insulated state. The contact 404 is formed on the G inspection wiring 361.

An inspection wiring connection contact 323 corresponding to the third inspection wiring connection contact 320 from the left is first connected to a contact 405 adjacent thereto through an intermediation of the metal wiring 406 and is then connected to the B inspection wiring 362 through an intermediation of a wiring traversing line 407 and a contact 408, as in the case of the second inspection wiring connection contact 322. The wiring traversing line 407 is formed in the gate metal layer and intersects the R inspection wiring 360 and the G inspection wiring 361 in an insulated state. The contact 408 is formed on the B inspection wiring 362. The fourth and subsequent inspection wiring connection contacts 320 are sequentially connected to the R inspection wiring 360, the G inspection wiring 361, and the B inspection wiring 362 in the same manner.

The positions of the R inspection wiring 360, the G inspection wiring 361, and the B inspection wiring 362, and the inspection wiring connection contacts 320, which are described above, are merely an example, and are not limited thereto as long as the R inspection wiring 360, the G inspection wiring 361, and the B inspection wiring 362 are respectively connected to the inspection wiring connection contacts 320 in an appropriate manner. Moreover, the number of the pad connection contacts 310 and the number of the inspection wiring connection contacts 320 are not limited to those illustrated in FIG. 3. Further, the positions of the pads 330 may be changed according to the shapes of the output terminals of the driver 103.

Each of the pad connection contacts 310 and a corresponding one of the inspection wiring connection contacts 320 are connected to each other by the polysilicon film 350 formed in the polysilicon layer 302. Each of the polysilicon films 350 includes a transistor formation region 420 and a wiring region 430. In a part of the transistor formation region 420, an inspection transistor 410 is formed. The wiring region 430 has a smaller width than that of the transistor formation region 420 and is used as a wiring for connection to a corresponding one of the pad connection contacts 310 and a corresponding one of the inspection wiring connection contacts 320. The width of the transistor formation region 420 is larger than those of each of the pad connection contacts 310 and each of the inspection wiring connection contacts 320.

For example, as illustrated in FIG. 3, each of the first to third polysilicon films 350 from the left has the transistor formation region 420 on the side closer to the inspection wiring connection contact 320. On the other hand, each of the fourth to sixth polysilicon films 350 from the left has the transistor formation region 420 on the side closer to the pad connection contact 310. In the same manner, for the seventh and subsequent polysilicon films 350, the transistor formation regions 420 are formed in a zigzag pattern alternately for each set of three adjacent polysilicon films 350.

In the set of three adjacent polysilicon films 350, the transistor formation region 420 of the leftmost polysilicon film 350 illustrated in FIG. 3 is formed to have a width which is extended to the left. On the other hand, each of the transistor formation regions 420 of the remaining two polysilicon films 350 is formed to have a width which is extended to the right. The pattern as described above is selected for efficiently using a limited space between the pad connection contacts 310 and the inspection wiring connection contacts 320.

A part of the wiring region 430 of the polysilicon film 350 from the transistor formation region 420 to a corresponding one of the pad connection contacts 310 or a corresponding one of the inspection wiring connection contacts 320, which has a longer distance, can have a smaller width than that of another part of the wiring region 430, which has a shorter distance from the transistor formation region 420 to the other one of the corresponding one of the pad connection contacts 310 and the corresponding one of the inspection wiring connection contacts 320. Moreover, the width of the part of the wiring region 430, which has the longer distance, can be smaller than that of the pad connection contact 310 or the inspection wiring connection contact 320.

A central part of each of the wiring regions 430 on the second and third pad connection contacts 310 side from the left of FIG. 3 is formed closer to the leftmost polysilicon film 350 as viewed from a corresponding one of the pad connection contacts 310 and a corresponding one of the inspection wiring connection contacts 320. Each of the fourth and sixth polysilicon films 350 from the left is formed closer to the fifth polysilicon film 350 as viewed from a corresponding one of the pad connection contacts 310 and a corresponding one of the inspection wiring connection contacts 320. The seventh and subsequent polysilicon films 350 are arranged sequentially in the same pattern.

The single gate metal 390 is formed in the gate metal layer 301. The gate metal 390 is formed so as to traverse each of the polysilicon films 350 formed in the aforementioned manner. Then, the inspection transistor 410 is formed in a portion where the gate metal 390 overlaps each of the polysilicon films 350. The gate metal 390 is formed avoiding the wiring region 430 of each of the polysilicon films 350 so as to prevent the transistor from being formed in a position other than in a predetermined one.

The inspection transistors 410 are formed in the aforementioned manner, and the sets of the inspection transistors 410, each including three adjacent inspection transistors 410, are arranged in a zigzag pattern in a direction in which the pad connection contacts 310 and the inspection wiring connection contacts 320 are arranged. In other words, a plurality of transistor rows, each including three adjacent inspection transistors 410, are arranged in a zigzag pattern. When the side of the inspection wiring connection contacts 320 is viewed from the side of the pad connection contacts 310, there is an overlapping portion for each set of two adjacent transistor rows.

Next, a sectional structure of the periphery of the inspection transistors 410 is described. As illustrated in FIGS. 4 and 5, the polysilicon layer 302 is formed on the insulating layer 501. On the polysilicon layer 302, the gate metal layer 301 is formed with the insulating layer 502 interposed therebetween. On the gate metal layer 301, the insulating layer 503 is formed. On the insulating layer 503, the SD metal layer 303 is formed. In a portion where the pad connection contact 310 is formed, the SD metal layer 303 is formed to pass through the insulating layers 503 and 502 so as to be brought into contact with an upper part of the polysilicon layer 302.

The transistor formation regions 420 and the wiring regions 430 of the set of three adjacent polysilicon films 350 described above are formed in the polysilicon layer 302. Then, the gate metal 390 formed in the gate metal layer 301 is formed above the transistor formation regions 420 of the set of three adjacent polysilicon films 350 so as to cover the transistor formation regions 420 through an intermediation of the insulating layer 502. Here, as viewed from the cross section taken along the line V-V of FIG. 3, the gate metal 390 is formed above the transistor formation region 420, as illustrated in FIG. 5.

In the aforementioned structure, each of the inspection transistors 410 is formed by the transistor formation region 420 of the polysilicon film 350 and the gate metal 390 provided above the transistor formation region 420. Specifically, the inspection transistor 410 is formed by two layers, that is, the polysilicon layer 302 and the gate metal layer 301.

The gate metal layer 301 is formed of a conductive metal such as molybdenum and is formed to have a shape as illustrated in FIG. 4 through known lithography step and etching step. Each of the insulating layers 501, 502, and 503 is made of, for example, silicon dioxide ($SiO_2$) and is formed by a CVD method or the like. The polysilicon film 302 is formed, for example, of amorphous silicon by the CVD method. After amorphous silicon is crystallized into polycrystalline silicon by laser annealing, the obtained polycrystalline silicon is processed to have a shape as illustrated in FIGS. 3 to 5 through, for example, the known lithography step and etching step to form the polysilicon layer 302. Similarly, the SD metal layer 303 is formed to have a shape as illustrated in FIGS. 3 to 5 through the known lithography step and etching step. The SD metal layer 303 is formed of the same metal as that of a source electrode or a drain electrode of each of the TFTs provided in the pixel region 201.

The known lithography step is, for example, as follows. First, a photoresist is applied onto an insulating film. Then, the photoresist is irradiated with an ultraviolet ray or the like through an intermediation of a photomask having a predetermined pattern. When a pattern corresponding to the pattern on the photomask is transferred to the photoresist, the photoresist has a UV ray-irradiated portion and an unirradiated portion. In the UV ray-irradiated portion of the photoresist, a chemical reaction occurs. Then, the portion of the photoresist, in which the chemical reaction occurs, or the portion of the photoresist, in which no chemical reaction occurs, is removed by a development process to form the resist pattern.

By configuring the display panel 200 according to this embodiment as described above, the limited space between the pad connection contacts 310 and the inspection wiring connection contacts 320 can be efficiently used to ensure a larger width for each of the transistor formation regions 420. As a result, a large width can be ensured for each of the inspection transistors 410.

Figure 11:
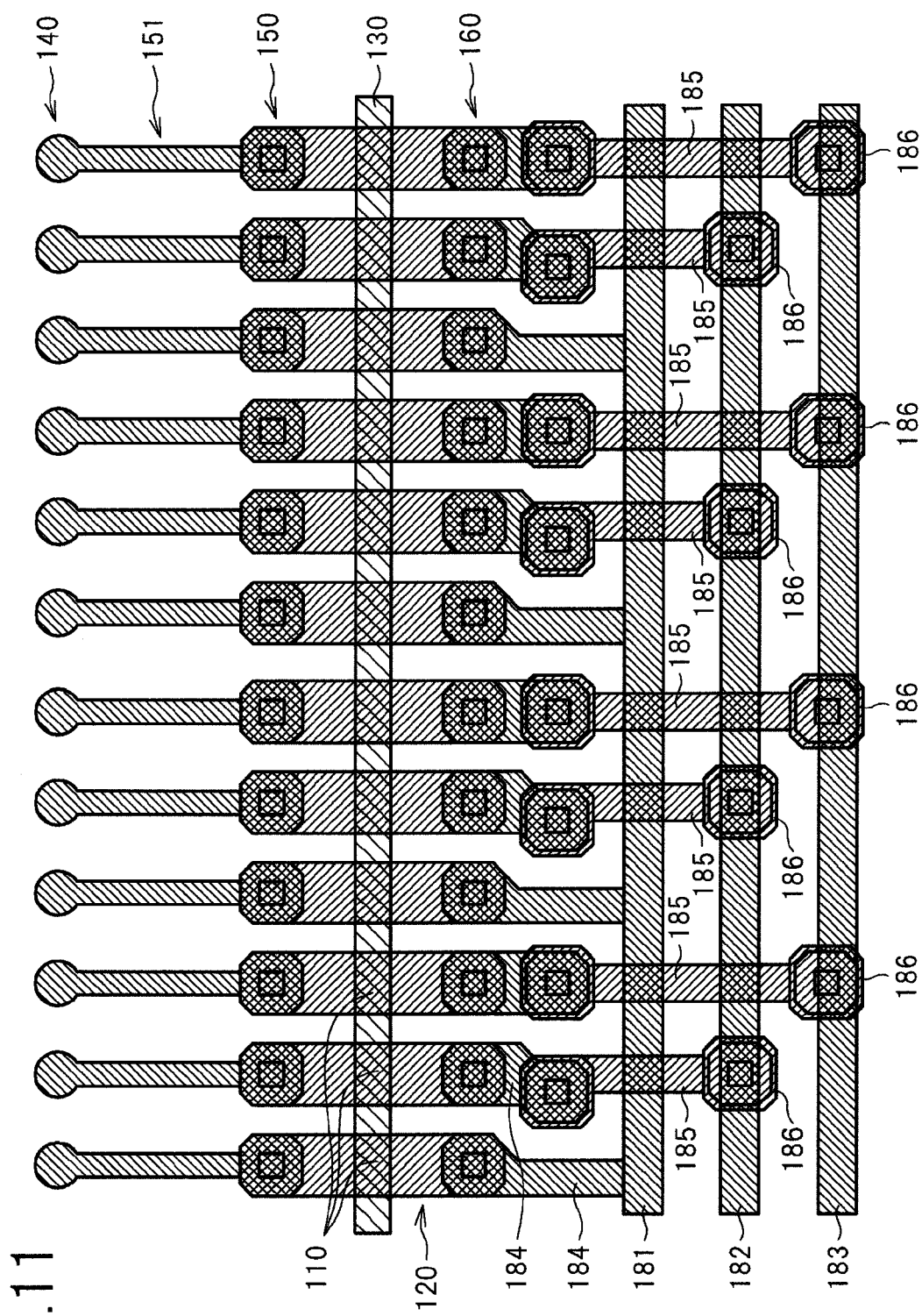
FIG. 11 is a diagram for illustrating problems to be solved by the present invention.

More specifically, for example, as illustrated in FIG. 3, a distance from a left end of the leftmost transistor formation region 420 to a right end of the third transistor formation region 420 from the left, is ensured to be larger than a distance from a left end of each of the first pad connection contact 310 and the first inspection wiring connection contact 320 to a right end of each of the third pad connection contact 310 and the third inspection wiring connection contact 320. Therefore, as compared with the case illustrated in FIG. 11, a larger width can be ensured for each of the inspection transistors 410.

For example, when a distance between the centers of the contacts in a direction in which the pads 330 are arranged according to the intervals between the output terminals of the driver is 15 μm, a width of 13 μm or larger, which is required as the width of the inspection transistor 410, can be ensured. As a result, the QD lighting inspection for the display panel 200 can be appropriately conducted.

Although the sets, each including three adjacent inspection transistors 410, are arranged in the zigzag pattern in this embodiment, the number of adjacent inspection transistors 410 constituting each of the sets arranged in the zigzag pattern may be other than three. In particular, it is preferred that the number of adjacent inspection transistors 410 constituting each of the sets be two or larger and four or smaller.

In this embodiment, the pad connection contacts 310 correspond to a plurality of first contacts recited in the claims, whereas the inspection wiring connection contacts 320 correspond to a plurality of second contacts recited in the claims.

MODIFICATION EXAMPLE

Figure 6:
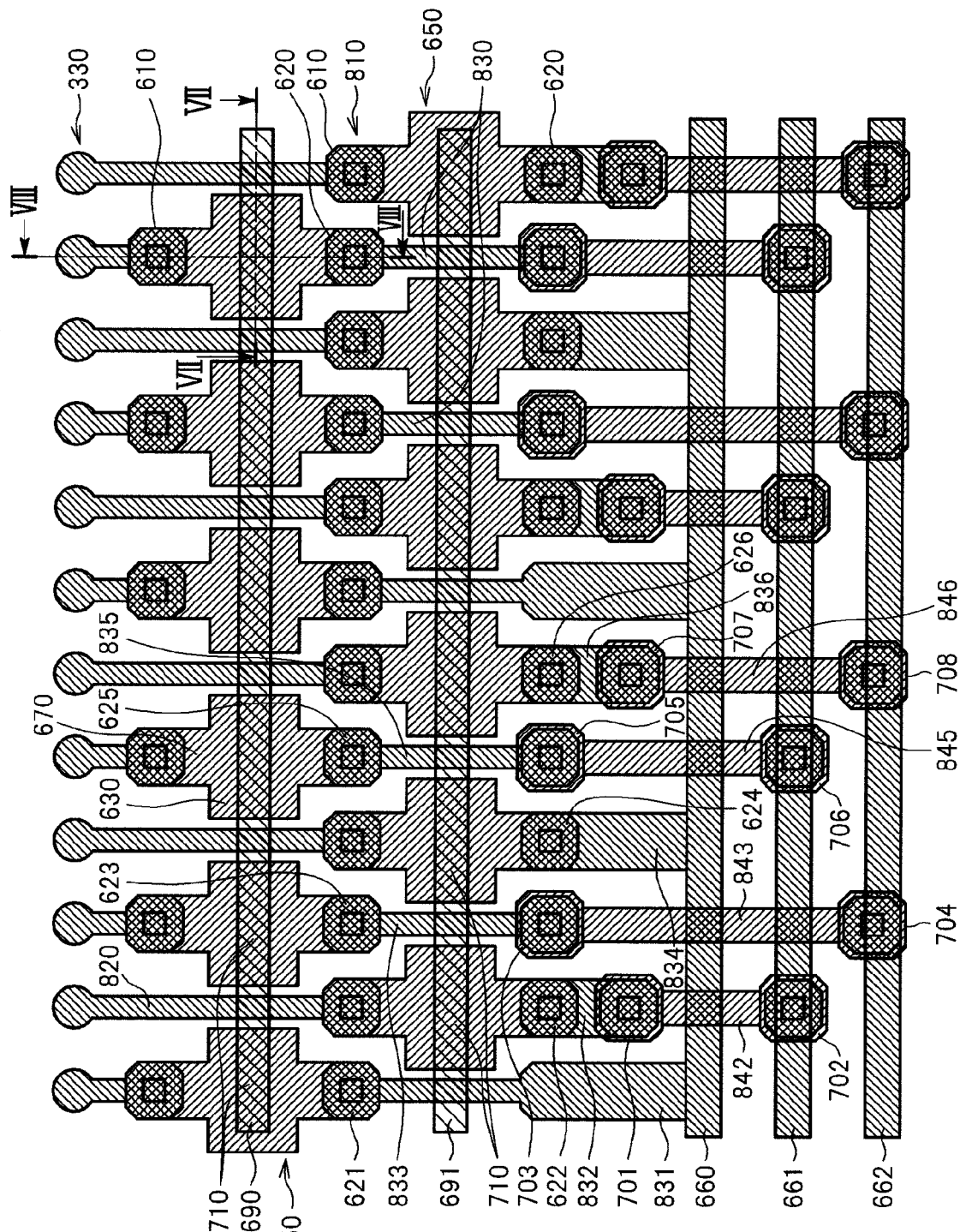
FIG. 6 is a schematic diagram illustrating a modification example of the QD lighting inspection circuit for the liquid crystal display panel according to the embodiment of the present invention.

FIG. 6 is a schematic diagram illustrating a modification example of the embodiment of the present invention. In contrast to the embodiment described above, pad connection contacts 610 are arranged in a zigzag pattern in the direction in which the pads 330 are arranged, that is, in a horizontal direction of FIG. 6 in this modification example. Similarly, inspection wiring connection contacts 620 are arranged in a zigzag pattern in the direction in which the pads 330 are arranged. Moreover, inspection transistors 710 are arranged in a zigzag pattern in the direction in which the pads 330 are arranged, for each inspection transistor 710. Further, in contrast to the gate metal 390 described in the above-mentioned embodiment, two gate metals 690 and 691 are provided. The gate metals 690 and 691 may be connected to each other at one ends thereof.

More specifically, for example, as illustrated in FIG. 6, the pad connection contacts 610 and the inspection wiring connection contacts 620 are arranged in the zigzag pattern so that a contact row 810 obtained by sequentially arranging the even-numbered pad connection contacts 610 from the left and the odd-numbered inspection wiring connection contacts 620 from the left is formed. Specifically, the contact row 810 is formed so that the even-numbered pad connection contacts 610 and the odd-numbered inspection wiring connection contacts 620 are sequentially arranged. The contact row 810 obtained by the arrangement as described above is located between the gate metal 690 and the gate metal 691, which are arranged at a distance from each other.

Moreover, the odd-numbered pad connection contacts 610 from the left are arranged in the direction in which the pads 330 are arranged, on the side of the contact row 810, which is closer to the pads 330. On the other hand, the even-numbered inspection wiring connection contacts 620 from the left are arranged in the direction in which the pads 330 are arranged, on the side of the contact row 810, which is opposite to the side where the pads 330 are provided.

The odd-numbered pad connection contacts 610 are connected to the pads 330 as in the embodiment described above.

However, the even-numbered pad connection contacts 610 are connected to the pads 330 through metal wirings 820.

An R inspection wiring 660, a G inspection wiring 661, and a B inspection wiring 662 are formed in this order on the side closer to the inspection wiring connection contacts 620 so as to be parallel in the direction in which the pads 330 are arranged. The inspection wiring connection contacts 620 are connected to the R inspection wiring 660, the G inspection wiring 661, and the B inspection wiring 662.

More specifically, in this modification example, for example, an inspection wiring connection contact 621 corresponding to the leftmost one of the plurality of inspection wiring connection contacts 620 is connected to the R inspection wiring 660 through an intermediation of a metal wiring 831, as illustrated in FIG. 6.

An inspection wiring connection contact 622 corresponding to the second inspection wiring connection contact 620 from the left is extended to a contact 701 formed below the inspection wiring connection contact 622 adjacent thereto in FIG. 6 through a metal wiring 832. Then, from the contact 701, the inspection wiring connection contact 622 bypasses the R inspection wiring 660 with a wiring traversing line 842, which is formed in the gate metal layer and intersects the R inspection wiring 660 in an insulate state, so as to be connected to the G inspection wiring 661 through a contact 702 formed on the G inspection wiring 661.

An inspection wiring connection contact 623 corresponding to the third inspection wiring connection contact 620 from the left is extended to a contact 703 formed between the second inspection wiring connection contact 622 and a fourth inspection wiring connection contact 624 through a metal wiring 833. Then, the inspection wiring connection contact 623 bypasses the R inspection wiring 660 and the G inspection wiring 661 with a wiring traversing line 843 connected to the contact 703 so as to be connected to the B inspection wiring 662 through a contact 704 formed on the B inspection wiring 662. The wiring traversing line 843 is formed in the gate metal layer and intersects the R inspection wiring 660 and the G inspection wiring 661 in an insulated state.

The fourth inspection wiring connection contact 624 is connected to the R inspection wiring 660 through an intermediation of a metal wiring 834 extended downward in FIG. 6.

A fifth inspection wiring connection contact 625 is extended through a metal wiring 835 to a contact 705 formed between the fourth inspection wiring connection contact 624 and a sixth inspection wiring connection contact 626. Then, the fifth inspection wiring connection contact 625 bypasses the R inspection wiring 660 with a wiring traversing line 845 connected to the contact 705 so as to be connected to the G inspection wiring 661 through a contact 706 formed on the G inspection wiring 661. The wiring traversing line 845 is formed in the gate metal layer and intersects the R inspection wiring 660 in an insulated state.

The sixth inspection wiring connection contact 626 is extended through a metal wiring 836 to a contact 707 formed below the sixth inspection wiring connection contact 626 adjacent thereto in FIG. 6. Then, from the contact 707, the sixth inspection wiring connection contact 626 bypasses the R inspection wiring 660 and the G inspection wiring 661 with a wiring traversing line 846 so as to be connected to the B inspection wiring 662 through a contact 708 formed on the B inspection wiring 662. The wiring traversing line 846 is formed in the gate metal layer and intersects the R inspection wiring 660 and the G inspection wiring 661 in an insulated manner.

The seventh and subsequent contacts 620 are connected sequentially to the R inspection wiring 660, the G inspection wiring 661, and the B inspection wiring 662, as in the case of the first to sixth inspection wiring connection contacts 621 to 626. In other words, the odd-numbered inspection wiring connection contacts, which form the contact row 810, are extended through metal wirings 830 and are connected to the R inspection wiring 660, the G inspection wiring 661, and the B inspection wiring 662. The metal wirings 830 (831, 832, 833, 834, 835, and 836) extended from polysilicon films 650 toward the corresponding inspection wirings 660, 661, and 662 are formed in the SD metal layer 750.

A width of each of the metal wirings 820 and 830 respectively connected to the pad connection contacts 610 and the inspection wiring connection contacts 620 is smaller than those of each of the pad connection contacts 610 and each of the inspection wiring connection contacts 620.

The positions of the R inspection wiring 660, the G inspection wiring 661, and the B inspection wiring 662, and the connection method therefor are not limited to the mode of connection illustrated in FIG. 6 as long as the R inspection wiring 660, the G inspection wiring 661, and the B inspection wiring 662 are connected through an intermediation of the metal wirings formed in the SD metal layer, the wirings and the contacts formed in the gate metal layers, and the like without being crossed.

Each of the pad connection contacts 610 and a corresponding one of the inspection wiring connection contacts 620 are connected to each other by the polysilicon film 650. The pad connection contacts 610 and the inspection wiring connection contacts 620 are respectively arranged in the zigzag patterns as described above. Therefore, the polysilicon films 650 are similarly arranged in the zigzag pattern in the direction in which the pads 330 are arranged.

Each of the polysilicon films 650 includes wiring regions 670 and a transistor formation region 630. The wiring regions 670 are respectively connected to a corresponding one of the pad connection contacts 610 and a corresponding one of the inspection wiring connection contacts 620. The transistor formation region 630 has a larger width than that of the wiring regions 670. The width of the transistor formation region 630 is larger than those of each of the pad connection contacts 610 and each of the inspection wiring connection contacts 620. In this modification example, in contrast to the embodiment described above, the widths of the wiring regions 670 connected to the pad connection contacts 610 and the inspection wiring contacts 620 are substantially the same.

The two gate metals 690 and 691 are formed so as to traverse the transistor regions 630 of the respective polysilicon films 650. As a result, the inspection transistors 710 are formed. More specifically, the gate metal 690 is provided so as to traverse the transistor regions 630 of the polysilicon films 650, which are formed between the odd-numbered pad connection contacts 610 and the odd-numbered inspection wiring connection contacts 620 from the left, and the even-numbered metal wirings 820 from the left.

On the other hand, the gate metal 691 is provided so as to traverse the transistor regions 630 of the polysilicon films 650, which are formed between the even-numbered pad connection contacts 610 and the even-numbered inspection wiring connection contacts 620 from the left, and the odd-numbered metal wirings 830 (831, 843, and 845) from the left. As a result, a plurality of the inspection transistors 710, which are arranged in the zigzag pattern in the direction in which the pads 330 are arranged, are formed along the gate metals 690 and 691. Next, a sectional structure of the periphery of the inspection transistor 710 is described. Similarly to the embodiment described above, as illustrated in FIG. 7 which is an enlarged sectional view taken along the line VII-VII of FIG. 6 and FIG. 8 which is an enlarged sectional view taken along the line VIII-VIII of FIG. 6, a polysilicon layer 730 is formed on an insulating layer 721. On the polysilicon layer 730, a gate metal layer 740 is formed with an insulating layer 722 interposed therebetween. On the gate metal layer 740, an insulating layer 723 is further formed. On the insulating layer 723, an SD metal layer 750 is formed.

As in the embodiment described above, the polysilicon films 650 are formed in the polysilicon layer 730, whereas the gate metals 690 and 691 are formed in the gate metal layer 740. The pad connection contacts 610, the inspection wiring connection contacts 620, the metal wirings 820, and the like are formed in the SD metal layer 750. The layers are respectively made of the same materials as those described in the aforementioned embodiment. In addition, the shapes illustrated in FIGS. 7 and 8 are formed by the same methods as those described in the aforementioned embodiment.

Figure 7:
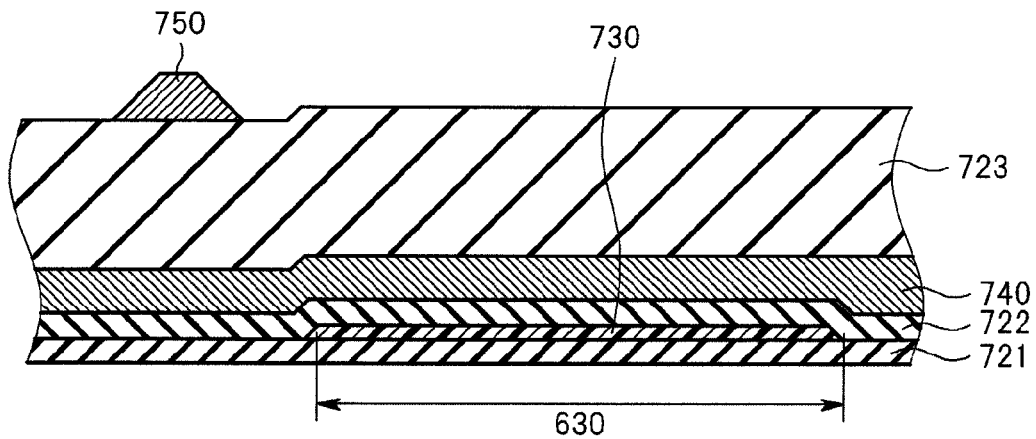
FIG. 7 is an enlarged sectional view of the QD lighting inspection circuit, taken along the line VII-VII of FIG. 6.
Figure 8:
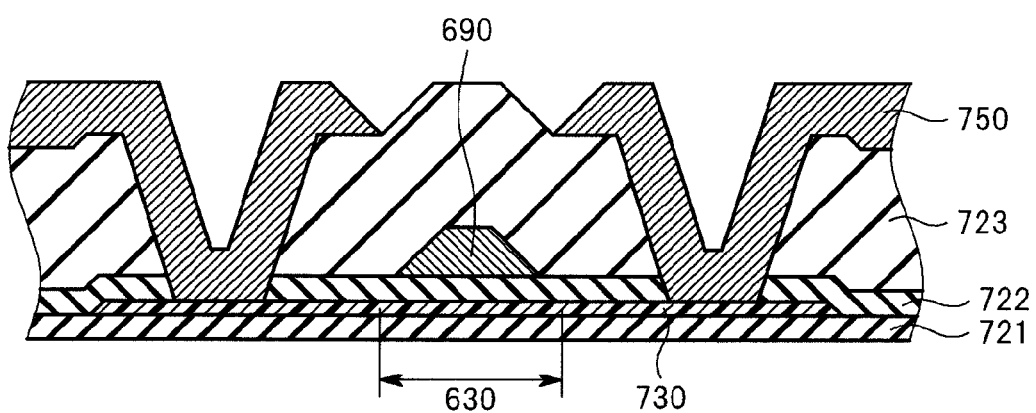
FIG. 8 is an enlarged sectional view of the QD lighting inspection circuit, taken along the line VIII-VIII of FIG. 6.
Figure 9:
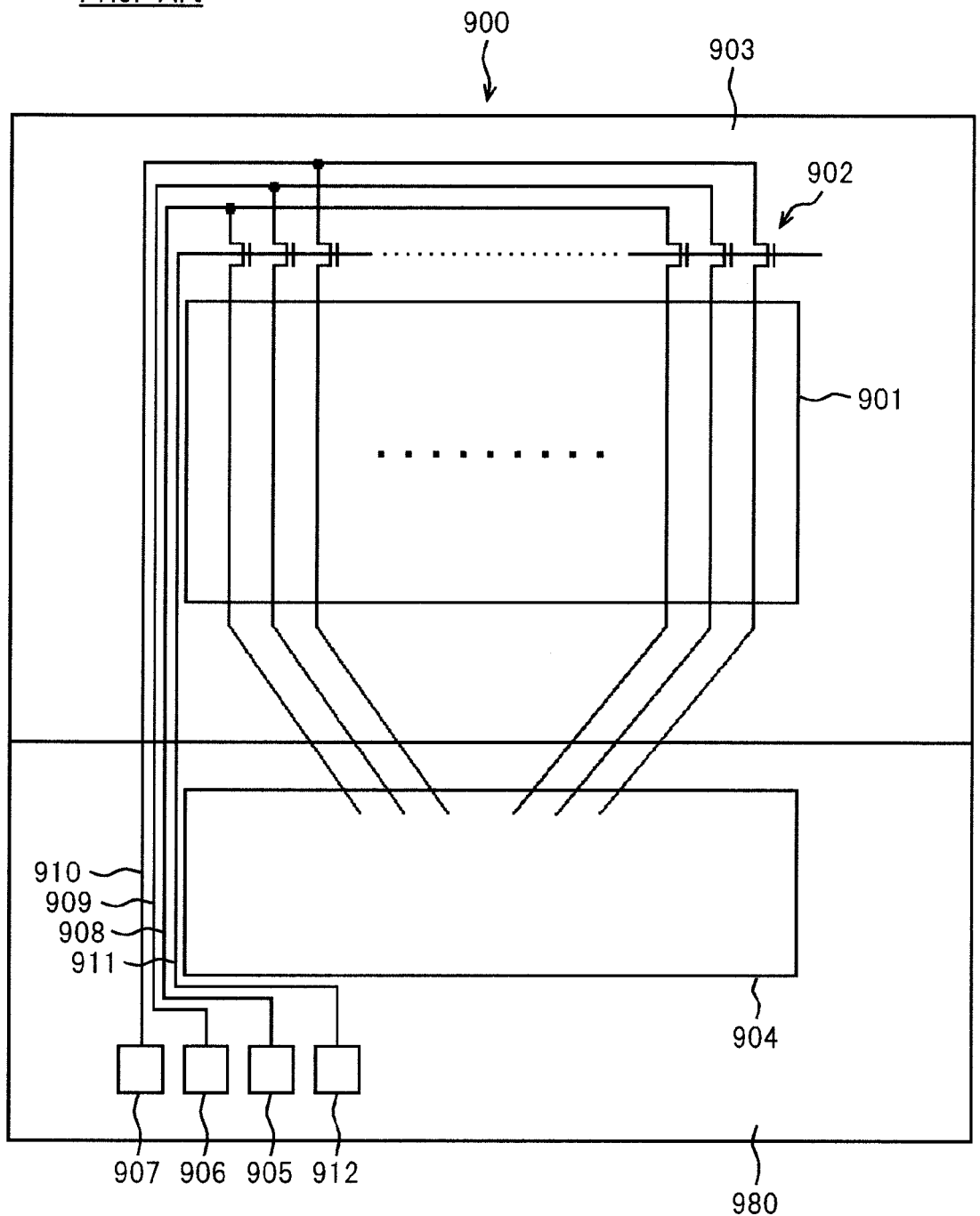
FIG. 9 is a schematic diagram illustrating a conventional display panel.
Figure 10:
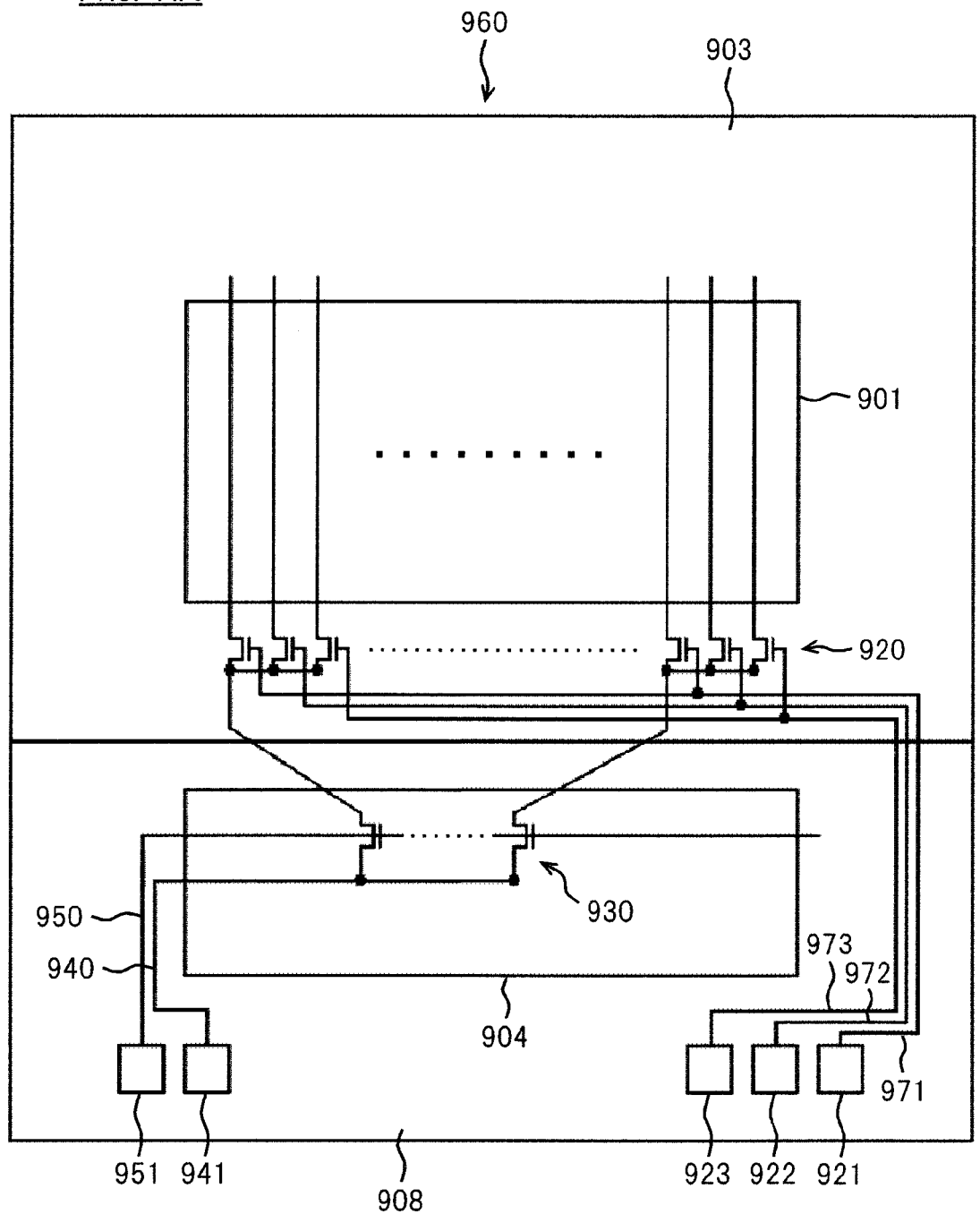
FIG. 10 is a schematic diagram illustrating another conventional display panel.

As viewed from the cross section of FIG. 7, which is taken along the line VII-VII of FIG. 6, the gate metal 690 is formed in the gate metal layer 740 above the transistor formation region 630 of the polysilicon film 650 located to be included in the polysilicon layer 730 so as to cover the transistor formation region 630. At this time, as viewed from the cross section of FIG. 8, which is taken along the line VIII-VIII of FIG. 6, the gate metal 690 is formed above a part of the transistor formation region 630 of the polysilicon film 650. Similarly, the gate metal 691 is formed above the transistor formation region 630 of the polysilicon film 650 so as to cover the transistor formation region 630.

In the structure described above, the inspection transistors 710 are formed by the gate metals 690 and 691, each being formed so as to traverse the transistor formation regions 630 of the polysilicon films 650. Specifically, each of the inspection transistors 710 is formed by two layers, that is, the polysilicon layer 730 and the gate metal layer 740.

According to the structure described above, for each of the inspection transistors 710 arranged in the zigzag pattern, a width of each of the transistor formation regions 630, which is equal to a distance between the two metal wirings respectively connected to the contacts, for example, equal to a distance between the metal wirings 820 connected to the even-numbered pad connection contacts 610 illustrated in FIG. 6, can be ensured. Moreover, if the short-circuiting between the polysilicon films 650 and the like are not taken into consideration, the width of each of the transistor formation regions 630, which is equal to a distance between two contacts, for example, a distance between the centers of the even-numbered pad connection contacts 610 of FIG. 6, can be ensured.

Moreover, by arranging the pad connection contacts 610 and the inspection wiring connection contacts 620 in the zigzag patterns so as to form the contact row 810 as described above, a space for the inspection transistors 710 can be efficiently ensured in a limited space between the pad connection contacts 610 and the inspection wiring connection contacts 620.

Further, in this modification example, the width of each of the wiring regions 670 is not required to be smaller than a distance between the adjacent pad connection contacts 610 or a distance between the adjacent inspection wiring connection contacts 620, unlike the embodiment described above. Therefore, a sufficiently large width of each of the inspection transistors 710 can be more efficiently ensured.

More specifically, for example, when a distance between the centers of the contacts in the direction in which the pads are arranged according to the intervals between the output terminals of the driver is 15 μm, a width of 22 μm is ensured for the width of each of the inspection transistors. Therefore, a width of 13 μm or larger, which is necessary as the width of the inspection transistor, can be ensured.

In this modification example, the pad connection contacts 610 correspond to the plurality of first contacts recited in the claims, whereas the inspection wiring connection contacts 620 correspond to the plurality of second contacts recited in the claims.

The present invention is not limited to the liquid crystal display panel. The present invention is also applicable to, for example, other types of display panels such as an organic EL display panel. Moreover, the present invention is not limited to the embodiment and modification example described above, and therefore modification examples other than that described above are possible. The aforementioned structure can be replaced by substantially the same structure, a structure having the same functions and effects, or a structure enabling the achievement of the same object.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display panel comprising:
a plurality of pads configured to provide a driver thereon;
a plurality of first contacts respectively connected to the plurality of pads;
a plurality of second contacts respectively provided so as to be opposed to the plurality of first contacts;
a polysilicon layer configured to form a plurality of polysilicon films to connect the plurality of first contacts and the plurality of second contacts to each other; and
a gate metal layer different from the polysilicon layer, wherein the gate metal layer forms at least one gate metal,
wherein the gate metal layer traverses the plurality of polysilicon films so as to form a plurality of transistors,
wherein the plurality of transistors are arranged in a zigzag pattern for each transistor set including at least one adjacent transistor, and
wherein a width of a portion of each of the plurality of polysilicon films, the portion forming a corresponding one of the plurality of transistors, is larger than a width of another portion of the each of the plurality of polysilicon films, the another portion being connected to a corresponding one of the plurality of first contacts and the plurality of second contacts.

2. The display panel according to claim 1, wherein the plurality of transistors comprise a plurality of transistor rows, each including at least two adjacent transistors, and the plurality of transistor rows are arranged in the zigzag pattern.

3. The display panel according to claim 2, wherein a number of the transistors included in each of the plurality of transistor rows is four or less.

4. The display panel according to claim 2, wherein the plurality of transistor rows have an overlapping portion when the plurality of second contacts are viewed from the plurality of first contacts.

5. The display panel according to claim 2, wherein a width of a portion of the each of the plurality of polysilicon films located between the plurality of transistor rows is smaller than the width of the portion of the each of the plurality of polysilicon films, the portion forming the corresponding one of the plurality of transistors.

6. The display panel according to claim 1, wherein the gate metal layer comprises two gate metals, and the plurality of transistors are arranged in the zigzag pattern for each one of the plurality of transistors.

7. The display panel according to claim 6, wherein the plurality of first contacts and the plurality of second contacts are respectively arranged in the zigzag patterns in a direction in which the plurality of pads are arranged.

8. The display panel according to claim 7, wherein the plurality of first contacts and the plurality of second contacts form one contact row between the two gate metals.

9. The display panel according to claim 7, further comprising a plurality of metal wirings in a metal wiring layer,
wherein the metal wiring layer is formed as a layer different from the polysilicon layer and the gate metal layer,
wherein each of the plurality of metal wirings is connected to a corresponding one of the plurality of first contacts and a corresponding one of the plurality of second contacts, and
wherein a width of the each of the plurality of metal wirings is smaller than widths of each of the plurality of first contacts and each of the plurality of second contacts.

10. The display panel according to claim 8, wherein the two gate metals traverse the plurality of metal wirings connected to the plurality of first contacts and the plurality of second contacts forming the one contact row.

11. The display panel according to claim 1, wherein the width of the portion of the each of the plurality of polysilicon films, the portion forming the corresponding one of the plurality of transistors, is larger than widths of each of the plurality of first contacts and each of the plurality of second contacts.

12. The display panel according to claim 1, further comprising an insulating layer between the polysilicon layer and the gate metal layer.

* * * * *